(12) United States Patent
Yen

(10) Patent No.: US 8,415,088 B2
(45) Date of Patent: Apr. 9, 2013

(54) METHOD FOR FORMING A MATERIAL LAYER

(75) Inventor: Yu-Lin Yen, Taipei (TW)

(73) Assignee: MACRONIX International Co., Ltd., Hsinchu (TW)

(*) Notice: Subject to any disclaimer, the term of this patent is extended or adjusted under 35 U.S.C. 154(b) by 966 days.

(21) Appl. No.: 11/377,159

(22) Filed: Mar. 15, 2006

(65) Prior Publication Data

US 2007/0218410 A1    Sep. 20, 2007

(51) Int. Cl.
  *G06F 7/26* (2006.01)
(52) U.S. Cl.
  USPC ............................. 430/311; 430/327; 430/950
(58) Field of Classification Search .................. None
  See application file for complete search history.

(56) References Cited

U.S. PATENT DOCUMENTS

| 4,592,129 | A  | * | 6/1986  | Legge .............................. 438/72 |
| 5,674,356 | A  | * | 10/1997 | Nagayama ..................... 438/694 |
| 6,855,949 | B2 | * | 2/2005  | De Leeuw et al. .............. 257/40 |
| 7,198,976 | B2 | * | 4/2007  | Hirata ............................. 438/73 |

* cited by examiner

*Primary Examiner* — Kathleen Duda
(74) *Attorney, Agent, or Firm* — J.C. Patents

(57) ABSTRACT

A method for forming a material layer with an anti-reflective layer as the top surface. The method comprises steps of providing a material layer and performing an ion implantation process to change a plurality of physical properties of a portion of the material layer near a top surface of the material layer so as to covert the portion of the material layer into an anti-reflective layer.

12 Claims, 3 Drawing Sheets

METHOD FOR FORMING A MATERIAL LAYER

BACKGROUND OF THE INVENTION

1. Field of Invention

The present invention relates to a method for forming a material layer. More particularly, the present invention relates to a method for forming a material layer with an anti-reflective surface.

2. Description of Related Art

During a photolithography process of an integrated circuit (IC) fabrication, photo masks are often used to transfer several patterns onto a wafer. During the pattern transferring process, a photoresist layer is irradiated with light passing through the photo mask. After the development process, the unwanted areas of photoresist layer are removed to leave behind the desired patterned photoresist layer. However, it is well known that the photoresist layer is formed over many reflective material layers which often reflect light into regions of photoresist layer that are not intended to be irradiated. The unintentional irradiation causes the resulting patterned photoresist layer to be inaccurate by causing reflective notching in the patterned photoresist layer or inaccurate line width.

Reflective notching on highly reflective substrates and line width (or critical dimension, CD) variations due to topography and film thickness non-uniformity have been a difficult problem for semiconductor manufacturers. A useful method such as an anti-reflective coating (ARC) has been developed to suppress reflectivity, which method involves applying an ARC layer over the reflective material layer before the application of the photoresist layer. However, physical properties including refractive index and the absorption coefficient of the conventional anti-reflective coating cannot be customized to meet different application requirements. That is, it is not easy to adjust the physical property of the currently used anti-reflective coating to obtain the optimized process result.

SUMMARY OF THE INVENTION

Accordingly, at least one objective of the present invention is to provide a method for patterning a material layer. By using the method according to the present invention, the physical property can be well adjusted to meet the application requirement.

At least another objective of the present invention is to provide a method for partially converting a material layer into an anti-reflective layer without further forming an anti-reflective coating. By using the method according to the present invention, the anti-reflective layer can be in form of multi-layered structure with various values of each physical property.

To achieve these and other advantages and in accordance with the purpose of the invention, as embodied and broadly described herein, the invention provides a method for patterning a material layer over a substrate. The method comprises steps of performing a pre-treatment process to convert a portion of the material layer near a top surface of the material layer into an anti-reflective layer. In addition, a patterned photoresist layer is formed on the anti-reflective layer and the material layer is patterned by using the patterned photoresist layer as a mask.

In the present invention, the pre-treatment process comprises a step of performing an ion implantation process to change a plurality of physical properties of a portion of the material layer near the top surface of the material layer. Further, the ion implantation process is accomplished by implanting, for example, boron ions, arsenic ions, germanium ions, antimony ions, silicon ions or phosphorous ions into the material layer. Also, the physical properties include the refractive index and the absorption coefficient. Moreover, each value of the refractive index and the absorption coefficient of the anti-reflective layer varies from a top surface of the anti-reflective layer to a bottom surface of the anti-reflective layer. Furthermore, the material layer is made of dielectric material.

The present invention also provides a method for partially converting a reflective layer into an anti-reflective layer. The method comprises the steps of providing a reflective layer and performing an ion implantation process to change a plurality of physical properties of a portion of the reflective layer near a top surface of the reflective layer so as to covert the portion of the reflective layer into an anti-reflective layer.

In the present invention, the physical properties include the refractive index and the absorption coefficient. In addition, the value of each physical property varies from a top surface of the anti-reflective layer to a bottom surface of the anti-reflective layer. The ion implantation process is accomplished by implanting, for example, boron ions, arsenic ions, germanium ions, antimony ions, silicon ions or phosphorous ions into the reflective layer. Furthermore, the reflective layer is made of dielectric material or photoresist material.

The present invention further provides a method for patterning a material layer over a substrate. The method comprises steps of forming a first photoresist layer on the material layer and then performing a pre-treatment process to convert a portion of the first photoresist layer near a top surface of the first photoresist layer into an anti-reflective layer. Thereafter, a second photoresist layer is formed on the anti-reflective layer. Then, the second photoresist layer, the anti-reflective layer and the first photoresist layer are defined. The material layer is patterned by using the patterned second photoresist layer, the patterned anti-reflective layer and the patterned first photoresist layer as masks.

In the present invention, the pre-treatment process comprises a step of performing an ion implantation process to change a plurality of physical properties of a portion of the first photoresist layer near the top surface of the first photoresist layer. Also, the physical properties include the refractive index and the absorption coefficient. The ion implantation process is accomplished by implanting, for example, boron ions, arsenic ions, germanium ions, antimony ions, silicon ions or phosphorous ions into the first photoresist layer. Moreover, each value of the refractive index and the absorption coefficient of the anti-reflective layer vary from a top surface of the anti-reflective layer to a bottom surface of the anti-reflective layer. The thickness of the anti-reflective layer is of about 100-400 angstroms. The material layer is made of dielectric material.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
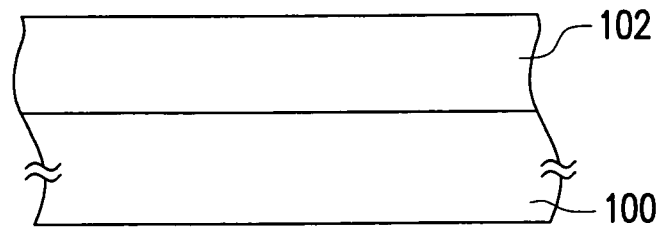
FIGS. 1A through 1C are cross-sectional views showing a method for patterning a material layer according to a preferred embodiment of the invention.
Figure 1B:
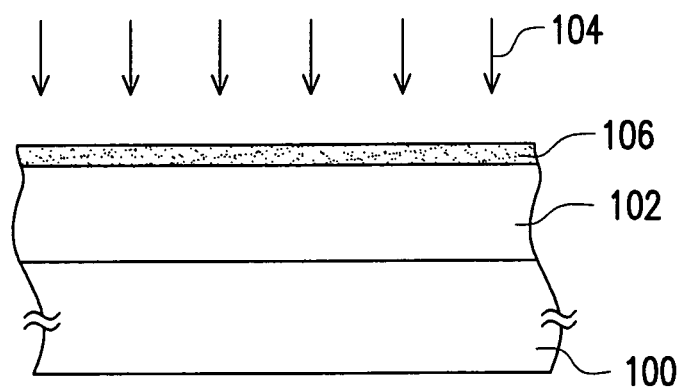
Figure 1C:
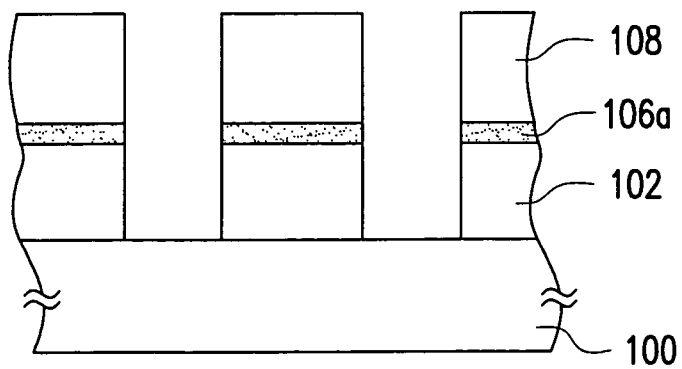
Figure 2:
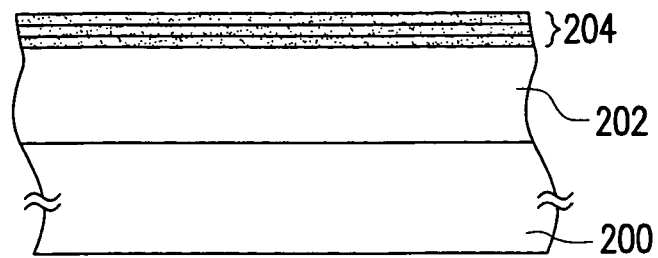
FIG. 2 is a cross-sectional view showing an anti-reflective layer according to another preferred embodiment of the invention.

FIGS. 1A through 1C are cross-sectional views showing a method for patterning a material layer according to a preferred embodiment of the invention. As shown in FIG. 1A, a substrate 100 having several semiconductive devices (not shown) formed thereon is provided. A material layer 102 is formed over the substrate 100. The material layer 102 can be, for example but not limited to, made of dielectric material. Thereafter, as shown in FIG. 1B, a pre-treatment process 104 is performed to convert a portion of the material layer 102 near a top surface of the material layer 102 into an anti-reflective layer 106. Notably, the pre-treatment process 104 comprises a step of performing an ion implantation process to change the physical properties of the portion of the material layer 102 near the top surface of the material layer so that the portion of the material layer 102 near the top surface is converted into the anti-reflective layer 106. Further, the ion implantation process can be, for example but not limited to, accomplished by implanting boron ions, arsenic ions, germanium ions, antimony ions, silicon ions or phosphorous ions into the material layer 102. Also, the physical properties comprise the refractive index and the absorption coefficient. Hence, after the pre-treatment process 104 is performed, the material property of the portion of the material layer 102 near the surface of the material layer 102 is converted from the reflective property into the anti-reflective property. Moreover, in this embodiment of the present invention, only one anti-reflective layer 106 is transformed from a portion of the material layer 102. However, the present invention is not limited by the configuration of the anti-reflective layer 106 mentioned above. With changing the dosage, the implanting energy and the types of the implanted ions, the anti-reflective layer can be also form as a multi-layered structure labeled 204 in FIG. 2. That is, each value of the physical properties including the refractive index and the absorption coefficient of the anti-reflective layer varies from a top surface of the anti-reflective layer 204 to a bottom surface of the anti-reflective layer 204. Furthermore, the total thickness of the anti-reflective layer is of about 10 to 10,000 angstroms; preferably, the thickness is between about 100 to 1000 angstroms.

As shown in FIG. 1C, a patterned photoresist layer 108 is formed on the anti-reflective layer 106. Then, by using the patterned photoresist layer 108 as a mask, the anti-reflective layer 106 and the material layer 102 are patterned and the anti-reflective layer 106 and the material layer 102 are converted into the anti-reflective layer 106a and the material layer 102a respectively.

Figure 3A:
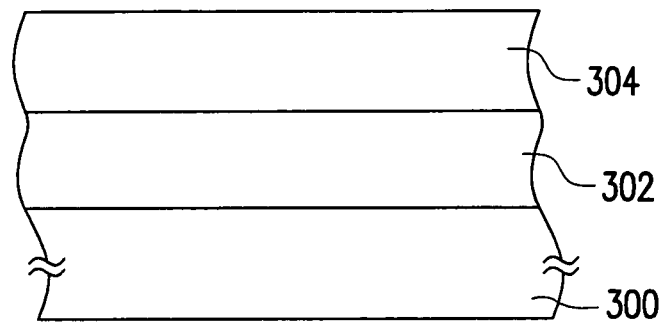
FIGS. 3A through 3D are cross-sectional views showing a method for patterning a material layer according to the other preferred embodiment of the invention.

FIGS. 3A through 3D are cross-sectional views showing a method for patterning a material layer according to the other preferred embodiment of the invention. As shown in FIG. 3A, a substrate 300 having several semiconductive devices (not shown) formed thereon is provided. A material layer 302 is formed over the substrate 300. The material layer 302 can be, for example but not limited to, made of dielectric material.

Figure 3B:
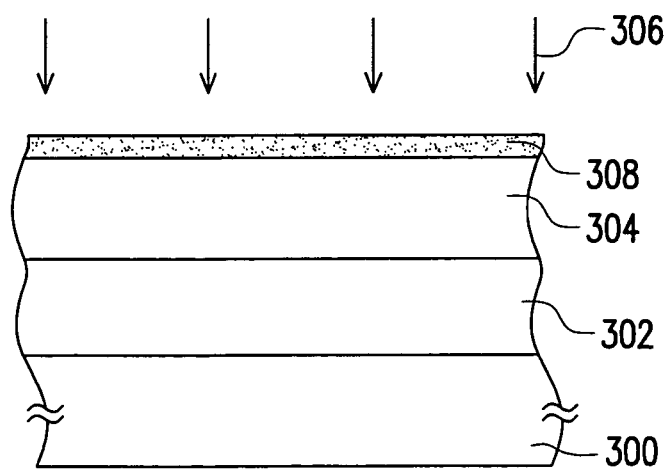
Figure 4:
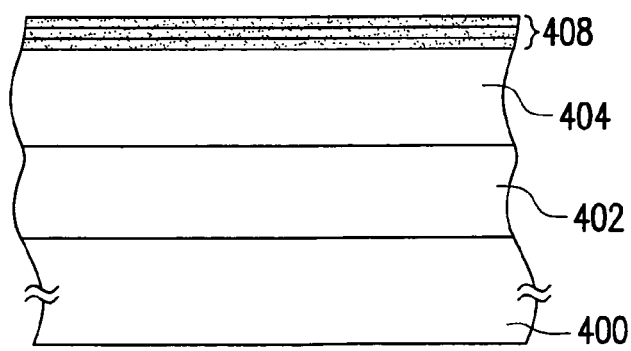
FIG. 4 is a cross-sectional view showing another anti-reflective layer according the other preferred embodiment of the invention.

Thereafter, a first photoresist layer 304 is formed on the material layer 302. As shown in FIG. 3B; a pre-treatment process 306 is performed to convert a portion of the first photoresist layer 304 near a top surface of the first photoresist layer 304 into an anti-reflective layer 308. It should be noticed that the pre-treatment process 306 comprises a step of performing an ion implantation process to change the physical properties of the portion of the first photoresist layer 304 near the top surface so that the portion of the first photoresist layer 304 near the top surface is converted into the anti-reflective layer 308. Also, the physical properties include the refractive index and the absorption coefficient. Moreover, the ion implantation process can be, for example but not limited to, accomplished by implanting boron ions, arsenic ions, germanium ions, antimony ions, silicon ions or phosphorous ions into the first photoresist layer 304. Therefore, after the pre-treatment process 306 is performed, the material property of the portion of the first photoresist layer 304 near the surface of the first photoresist layer 304 is converted from the reflective property into the anti-reflective property. In addition, in this embodiment of the present invention, only one anti-reflective layer 308 is transformed from a portion of the first photoresist layer 304. However, the present invention is not limited by the configuration of the anti-reflective layer 308 mentioned above. With changing the dosage, the implanting energy and the types of the implanted ions, the anti-reflective layer can be also form as a multi-layered structure labeled 408 in FIG. 4. That is, each value of the refractive index and the absorption coefficient of the anti-reflective layer 408 vary from a top surface of the anti-reflective layer 408 to a bottom surface of the anti-reflective layer 408. Furthermore, the total thickness of the anti-reflective layer is about 10 to 10,000 angstroms; preferably, the thickness is about 100 to 1000 angstroms.

Figure 3C:
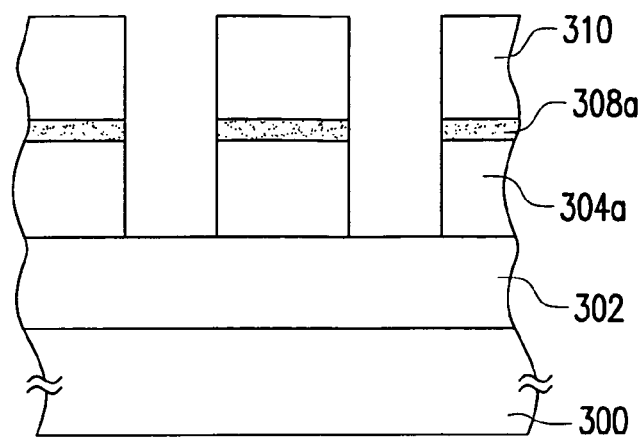
Figure 3D:
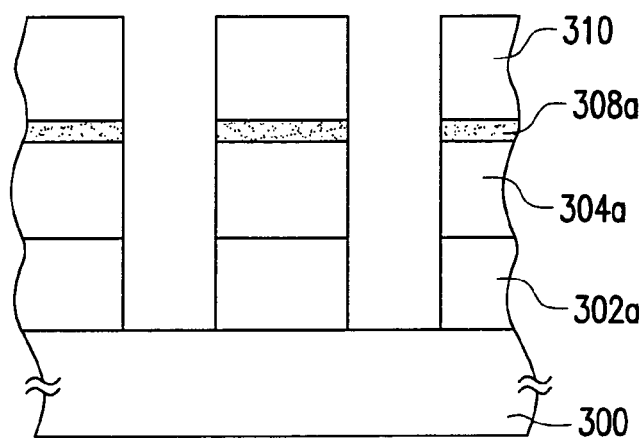

As shown in FIG. 3C, a second photoresist layer (not shown) is formed on the anti-reflective layer 308. Then, the second photoresist layer, the anti-reflective layer 308 and the first photoresist layer 304 are defined and the second photoresist layer, the anti-reflective layer 308 and the first photoresist layer 304 are converted into the second photoresist layer 310, the anti-reflective layer 308a and the first photoresist layer 304a respectively with a pattern formed therein. As shown in FIG. 3D, by using the patterned second photoresist layer 310, the patterned anti-reflective layer 308a and the patterned first photoresist layer 304a as masks, the material layer 302 is patterned.

In the present invention, with changing the ion implanting dosage, implanting energy and the types of the implanted ions, the numbers of the anti-reflective layers transformed from the material layer or the photoresist layer can be well controlled. Meanwhile, the refraction index and the absorption coefficient of the anti-reflective layer can be adjusted by applying different implanting dosage, implanting energy and types of the implanted ions so as to obtain a customized anti-reflective layer. Furthermore, the anti-reflective layer in form of multi-layered structure with diverse values of each physical property can be produced by applying the present invention.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for patterning a material layer over a substrate, comprising:

performing a pre-treatment process to convert a portion of the material layer near a top surface of the material layer into an anti-reflective layer, wherein the pre-treatment process is accomplished by implanting ions, the anti-reflective layer is formed as a multi-layered structure with changing the dosage, the implanting energy and the types of the implanted ions, and each value of a refractive index and a absorption coefficient of the anti-reflective layer varies from a top surface of the anti-reflective layer to a bottom surface of the anti-reflective layer;

forming a patterned photoresist layer on the anti-reflective layer; and patterning the material layer by using the patterned photoresist layer as a mask.

2. The method of claim 1, wherein the thickness of the anti-reflective layer is of about 100-400 angstroms.

3. The method of claim 1, wherein the material layer is made of dielectric material.

4. The method of claim 1, wherein the multi-layered structure comprises three layers.

5. The method of claim 1, wherein the pre-treatment process is accomplished by implanting ions selected from the group consisting of boron ions, arsenic ions, germanium ions, antimony ions, silicon ions and phosphorous ions into the material layer.

6. A method for partially converting a reflective layer into an anti-reflective layer comprising:

providing a reflective layer; and performing an ion implantation process to change a plurality of physical properties of a portion of the reflective layer near a top surface of the reflective layer so as to covert the portion of the reflective layer into an anti-reflective layer, wherein the ion implantation process is accomplished by implanting ions, the anti-reflective layer is formed as a multi-layered structure with changing the dosage, the implanting energy and the types of the implanted ions, and each value of a refractive index and a absorption coefficient of the anti-reflective layer varies from a top surface of the anti-reflective layer to a bottom surface of the anti-reflective layer.

7. The method of claim 6, wherein the thickness of the anti-reflective layer is about 100-400 angstroms.

8. The method of claim 6, wherein the reflective layer is made of dielectric material.

9. The method of claim 6, wherein the reflective layer is made of photoresist material.

10. The method of claim 6, wherein the pre-treatment process is accomplished by implanting ions selected from the group consisting of boron ions, arsenic ions, germanium ions, antimony ions, silicon ions and phosphorous ions into the material layer.

11. A method for patterning a material layer over a substrate, comprising:

forming a first photoresist layer on the material layer;

performing a pre-treatment process to convert a portion of the first photoresist layer near a top surface of the first photoresist layer into an anti-reflective layer, wherein the pre-treatment process is accomplished by implanting ions, the anti-reflective layer is formed as a multi-layered structure with changing the dosage, the implanting energy and the types of the implanted ions, and each value of a refractive index and a absorption coefficient of the anti-reflective layer varies from a top surface of the anti-reflective layer to a bottom surface of the anti-reflective layer;

forming a second photoresist layer on the anti-reflective layer;

defining the second photoresist layer, the anti-reflective layer and the first photoresist layer; and patterning the material layer by using the patterned second photoresist layer, the patterned anti-reflective layer and the patterned first photoresist layer as masks.

12. The method of claim 11, wherein the pre-treatment process is accomplished by implanting ions selected from the group consisting of boron ions, arsenic ions, germanium ions, antimony ions, silicon ions and phosphorous ions into the material layer.

* * * * *